United States Patent [19]
Onishi et al.

[11] Patent Number: 4,977,039
[45] Date of Patent: Dec. 11, 1990

[54] SUPERCONDUCTING WIRE AND CABLE

[75] Inventors: Toshitada Onishi; Noboru Higuchi; Itaru Ishii, all of Tsukuba, Japan

[73] Assignee: Agency of Industrial Science and Technology, Tokyo, Japan

[21] Appl. No.: 488,979

[22] Filed: Mar. 5, 1990

[30] Foreign Application Priority Data

Mar. 27, 1989 [JP] Japan ................ 1-74473

[51] Int. Cl.$^5$ ............................ H01F 7/22; H01B 7/34
[52] U.S. Cl. ................... 428/623; 174/125.1; 428/930; 505/813
[58] Field of Search ............. 428/623, 930; 505/813; 174/125.1

[56] References Cited

U.S. PATENT DOCUMENTS

| | | | |
|---|---|---|---|
| 2,936,435 | 5/1960 | Buck | 428/930 |
| 3,163,832 | 12/1964 | Nahman et al. | 505/866 |
| 3,489,604 | 1/1970 | Benz et al. | 428/623 |
| 3,612,742 | 10/1971 | Snowden et al. | 505/886 |
| 3,618,205 | 11/1971 | Barber et al. | 505/929 |
| 3,713,211 | 1/1973 | Freeman, Jr. | 428/930 |
| 3,743,986 | 7/1973 | McInturff et al. | 505/887 |
| 4,341,924 | 7/1982 | Gleim | 505/813 |
| 4,394,534 | 7/1983 | Bahder et al. | 505/886 |
| 4,543,449 | 9/1985 | Kuroda | 428/930 |
| 4,647,888 | 3/1987 | Woolf et al. | 505/887 |

*Primary Examiner*—Theodore Morris
*Assistant Examiner*—David Schumaker
*Attorney, Agent, or Firm*—Oliff & Berridge

[57] ABSTRACT

A superconducting wire comprises a wire element wherein a plurality of superconducting filaments are arranged in a metallic matrix, and a covering layer which is formed on the surface of the wire element with a number of filaments and has a laminated structure including at least one insulator film as the lower layer and at least one thermal conductor film as the upper layer. Frictional heat generated on the surface of the superconducting wire is prevented from being conducted to superconducting filaments by virtue of the presence of the insulator film, and is conducted through the thermal conductor film to be dissipated. Therefore, the temperature of the superconducting filaments is hardly raised.

12 Claims, 2 Drawing Sheets

SUPERCONDUCTING WIRE AND CABLE

BACKGROUND OF THE INVENTION

1. Field of the Invention

The present invention relates to superconducting wires and cables, and particularly to a superconducting wire and cable excellent in stability and effective in the production of superconducting appliances adapted for a high electric current density.

2. Description of the Prior Art

FIG. 1 is a schematic cross-sectional view of the structure of a conventional superconducting wire. The superconducting wire 1 has a structure comprising a large number of superconducting filaments 3 made of NbTi, Nb$_3$Sn or the like and embedded in a metallic matrix 2 made of copper, a copper-tin alloy or the like. This superconducting wire 1 has the exposed surface of the metallic matrix 2.

FIG. 2 is a schematic cross-sectional view of the structure of another conventional superconducting wire. This superconducting wire 4 has a structure further comprising an insulator film 5 made of an inorganic or organic substance and covering the surface of the same wire element 1 with a large number of filaments as shown in FIG. 1.

In general, as shown in FIG. 3, a number of superconducting wires 1 shown in FIG. 1 or superconducting wires 4 shown in FIG. 2 are assembled into a cable 6, with which a superconducting appliance such as a superconducting magnet is produced. Flat cables produced by assembling a number of superconducting wires or cables as shown in FIG. 3 are also often used. An indispensable requirement for operating a superconducting appliance stably is to suppress the transient heat during excitation thereof as much as possible, which heat is caused by movement of a superconducting cable or the like. Accordingly, there have been proposed various ideas including application of high winding tension in the course of production of a coil for a superconducting magnet, sufficient precompression of a whole coil after the completion of winding the coil, and equalization of the heat shrinkages of individual members constituting a magnet.

Meanwhile, the instability of superconducting cables has heretofore been often observed. This is such a phenomenon that the superconducting state of wires is quenched through heating-up thereof caused by frictional heat generated, for example, by minute movement of the whole cable and/or wire elements constituting the cable and/or cracking of an epoxy resin used for the fixation of the superconducting wires, which is attributed to a strong electromagnetic force created when a large electric current is flowed through the superconducting cable. As described above, conventional superconducting wires and cable are substantially in a defenceless state against the transient heat, which may occur on the surfaces thereof, without any satisfactory countermeasures thereagainst with a view to providing sufficient stability for those wires and cables. The above-mentioned phenomenon tends to more strongly manifest as an operating current density is increased more. Such frictional heat generation entails an extreme difficulty in producing superconducting appliances capable of sufficiently exhibiting a feature of high current density inherent in superconductors.

The reason why the superconducting state of cables is quenched by the movement of the superconducting cables and/or wire elements constituting the cables is that heat generated on the surfaces of the superconducting wires 1 or 4 as the wire elements through friction between the cables or wire elements reaches superconducting filaments 3 inside the superconducting wires 1 or 4 to heat up the filaments 3 beyond the critical temperature thereof. As shown in FIGS. 1 and 2, however, conventional superconducting wires have a metallic matrix 2 either exposed or covered with an insulator film 5. Thus, either type of conventional superconducting wires are of such a structure that most of heat generated on the surfaces of the superconducting wires 1 or 4 reaches the superconducting filaments 3 inside the wires 1 or 4.

More specifically, where the metallic matrix 2 is exposed as shown in FIG. 1, heat generated on part of the surface of the superconducting wire 1, though partly conducted in the circumferential and longitudinal directions of the wire 1, mostly reaches the superconducting filaments 3 in a very short time because the superconducting filaments 3 is very close to the surface of the wire 1.

Also where the surface of the metallic matrix 2 is covered with the insulating film 5 as shown in FIG. 2, most of heat generated on part of the surface of the superconducting wire 4 reaches the superconducting filaments 3 despite the relatively low rate, or speed, of heat conduction from the surface of the wire 4 to the superconducting filaments 3 due to the barrier effect of the insulator film 5 on heat conduction because the heat is hardly conducted in the circumferential and longitudinal directions of the insulator film 5, or the wires 4, as well due to the extremely low thermal conductivity of the insulator film 5.

As described above, the conventional superconducting wires involve a problem of the superconducting state thereof being quenched with a high probability once heat is generated on the surfaces thereof through movement thereof or the like. This problem has been bottleneck in the production of highly reliable superconducting appliances.

SUMMARY OF THE INVENTION

The present invention has been made with a view to solving the above-mentioned problem. Accordingly, an object of the present invention is to provide a superconducting wire wherein heat generated on the surface thereof is not conducted in the radial direction thereof but in the longitudinal direction thereof to enable the superconducting wire to be stably operated even when a large electric current is flowed therethrough.

Another object of the present invention is to provide a superconducting cable which can be operated stably even when a large electric current is flowed therethrough.

In the first aspect of the present invention, a superconducting wire comprises:
 a wire element including a metallic matrix and a plurality of superconducting filaments arranged in the metallic matrix; and
 a covering layer which is formed on the surface of the metallic matrix and has a laminated structure having at least one insulator film as a lower layer and at least one thermal conductor film as an upper layer.

Here, the laminated structure may be composed of a plurality of insulator films and a plurality of thermal conductor films laminated alternately with each other.

The at least one thermal conductor film may be made of copper or copper alloy.

The at least one thermal conductor film may be made of silver.

The at least one thermal conductor film may be made of diamond.

The thickness of the at least one thermal conductor film may be in the range of 0.1 μm to 50 μm.

The at least one insulator film may be made of a polyimide resin.

The at least one thermal conductor film may be made of a polyvinylformal resin.

The at least one thermal conductor film may be made of a polyamide resin.

The thickness of the at least one insulator film may be in the range of 1 μm to 100 μm.

In the second aspect of the present invention, a superconducting cable comprising a plurality of superconducting wires each comprises:

a plurality of superconducting wires which are assembled to form the cable; each of the superconducting wires includes a wire element, which is composed of a metallic matrix and a plurality of superconducting filaments arranged in the metallic matrix, and a covering layer formed on a surface of the wire element and having a laminated structure of at least one insulator film as a lower layer and at least one thermal conductor film as an upper layer.

Here, the cable may be a flat cable.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
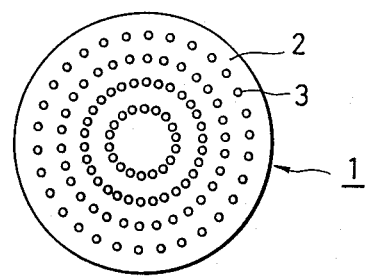
FIG. 1 is a schematic cross-sectional view of the structure of a conventional superconducting wire.
Figure 2:
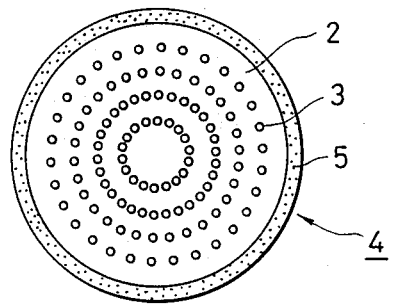
FIG. 2 is a schematic cross-sectional view of the structure of another conventional superconducting wire.
Figure 3:
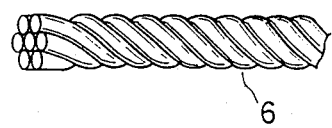
FIG. 3 is a perspective view of an example of the superconducting cable produced by assembling superconducting wires.
Figure 4:
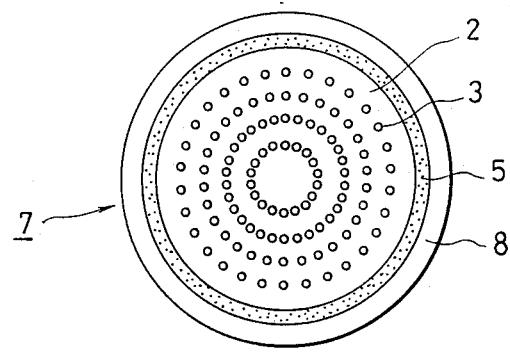
FIG. 4 is a schematic cross-sectional view of the structure of an example of the superconducting wire of the present invention.

FIG. 4 is a schematic cross-sectional view of the structure of an example of the superconducting wire of the present invention. The superconducting wire 7 comprises a wire element wherein a plurality of superconducting filaments 3 are arranged in a metallic matrix 2 made of copper, a copper-tin alloy or the like; an insulator film 5 formed around the circumference of the above-mentioned wire element; and a good thermal conductor film 8 made of copper, silver, diamond or the like and formed around the surface of the insulator film 5.

The formation of the thermal conductor film 8 around the surface of the insulator film 5 allows heat generated on the surface of the superconducting wire 7 to be speedily conducted in the circumferential and longitudinal directions thereof through the thermal conductor film 8, while the heat is hardly conducted in the radial direction of the superconducting wire 7 because the insulator film 5 serves as a barrier against heat conduction. Therefore, the temperature rise of the superconducting filaments 3 is very small.

One example of designing will be described. Where a copper film of 20 μm in thickness and 99.9% in purity is used as the thermal conductor film 8 while using a polyimide insulator film of 50 μm in thickness as the insulator film 5, the rate of heat conduction in the longitudinal direction of the superconducting wire 7 is 10,000 to 100,000 times as high as that in the radial direction of the superconducting wire 7. Since the amount of heat migration in the longitudinal direction of the superconducting wire 7 is very much larger than that in the radial direction of the wire 7 as described just above, most of frictional heat generated on the surface of the superconducting wire 7 to the accompaniment of movement thereof is conducted in the longitudinal direction of the superconducting wire 7 to be dissipated and hence removed therefrom, while the heat is hardly conducted toward the inside of the wire 7, in which the superconducting filaments 3 are present in arrangement. According to the calculation results, only about 10% of frictional heat reaches the central area of the superconducting wire 7. Since the amount of the frictional heat generated on the surface of the superconducting wire 7 is substantially proportional to the amount of movement of the wire 7, the acceptable amount of movement of the superconducting wire 7 can be increased at least 10 times as much as that of conventional superconducting wires by the formation of the thermal conductor film 8 around the outer circumference of the insulator film 5. This is a remarkable improving effect of the present invention.

When copper, silver or an alloy thereof is to be used as the material of the thermal conductor film 8, electroless plating formation of a film of the above-mentioned metal or alloy on the insulator film 5, following the coverage of the wire element 1 with the insulator film 5, will suffice. Alternatively, the insulator film 5 covering the wire element 1 may be wrapped with a metal or alloy foil to form a thermal conductor film. When diamond is to be used as the material of the thermal conductor film 8, the use of a chemical vapor deposition method of depositing diamond on an insulator film will suffice.

The thickness of the thermal conductor film 8 is suitably in the range of 0.1 μm to 50 μm. The principle of the present invention is that a rise of the temperature of the superconducting filaments is prevented by introduction of a large anisotropy in the thermal conductivity of the surface portion of the superconducting wire with respect to the longitudinal and radial directions thereof. When the thickness of the thermal conductor film is smaller than 0.1 μm, therefore, the above-mentioned thermal conductivity in the longitudinal direction is decreased so much as to substantially lose the above-mentioned anisotropy in the thermal conductivity, with the result that heat is conducted toward the inside of the superconducting wire to raise the temperature of the superconducting filaments. On the other hand, when the thickness of the thermal conductor film exceeds 100 μm, the superconducting wire is unfavorably too thick.

As the material of the insulating film to be used in the present invention, there can be mentioned organic substances such as polyimide resins, polytetrafluoroethylen formvar and polyamide resins; and inorganic substances such as ceramics (for example, alumina) and so on. Especially preferred are polyimide resins and polyvinylformal resin (for example, Formvar) having an excellent mechanical strength at low temperatures. Alternatively, polyamide resins (Nylon) can be used as an insulator film because metals are easily electroless plated thereon. The thickness of the insulator film is suitably in the range of 1 μm to 100 μm. As described above, the insulator film plays a role of thermal insulation as well as electrical insulation to prevent heat generated on the surface of the superconducting wire 7 from being conducted into the superconducting filaments 3. When the thickness of the insulator film is smaller than 1 μm, the thermal insulating action thereof is insufficient. When the thickness of the insulator film exceeds 100 μm, cooling of the superconducting wire is disturbed and further the diameter of the superconducting wire is unfavorably too large.

The following experiment was made to substantiate the effect of the thermal conductor film laminated on the insulating film. Fifty-three superconducting filaments 3 made of NbTi and having a diameter of 50 μm were embedded in a copper matrix 2 of 0.75 mm in diameter. The surface of the copper matrix 2 was coated with a polyimide resin film of 50 μm in thickness to prepare a superconducting wire. The cross-sectional area ratio of copper to NbTi in this superconducting wire was 3:1. The surface of the polyimide resin film 5 was tightly wrapped with a high-purity thin copper film 8 of 5 μm in thickness to produce a superconducting wire 7 having a structure as shown in FIG. 4. A heater was attached to the superconducting wire 7 in such a way as to simulate generation of frictional heat to the accompaniment of movement of the superconducting wire 7.

While flowing an electric current of 180A through the superconducting wire cooled with liquid helium, a current pulse having a duration time of 100 μsec was applied to the heater to generate heat pulses, by which quenching of the superconducting state of the superconducting wire was examined. In the case of the superconducting wire according to the present invention, the superconducting state thereof was quenched with heat pulses of about $1.6 \times 10^{-3}$ J/cm$^3$. In contrast, the superconducting state of a superconducting wire having a conventional structure not provided with a thin copper film for wrapping thereof was quenched with heat pulses of about $1.5 \times 10^{-4}$ J/cm$^3$. Thus, it was found out that the superconducting wire according to the present invention was about 10 times as stable against heating one the surface thereof as the conventional superconducting wire, and was superior in stability particularly within a high current density range.

Figure 5:
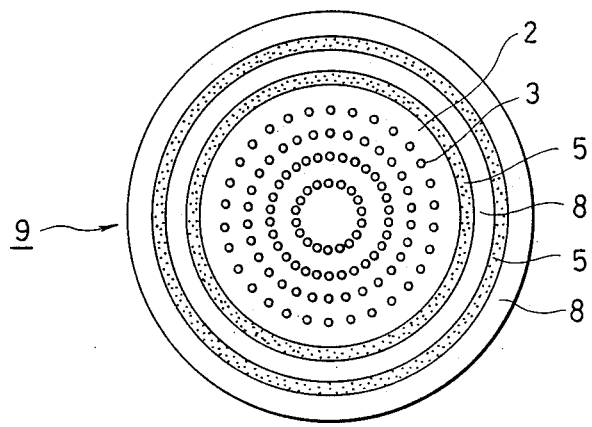
FIG. 5 is a schematic cross-sectional view of the structure of another example of the superconducting wire of the present invention.

FIG. 5 shows another example of the superconducting wire of the present invention. This superconducting wire 9 is of such a structure that the surface of a metallic matrix 2 having superconducting filaments 3 embedded therein is covered with a laminate consisting of two insulator films 5 and two thermal conductor films 8 laminated alternately with each other. Such an increase in the number of insulator films to two in combination with an increase in the number of thermal conductor films to two can be more effective in preventing heat generated on the surface of the superconducting wire from being conducted to superconducting filaments. Needless to say, it is possible to increase the number of insulator films as well as thermal conductor films to three or more in a laminate as mentioned above.

As described hereinbefore, a superconducting wire permitting of stable flow therethrough of a high-density electric current, which has heretofore been the impossible to realize, can be obtained according to the present invention, the feature of which lies in that the surface of a wire element, wherein a plurality of superconducting filaments are arranged in a metallic matrix, is covered with an insulator film made of an organic or inorganic substance in combination with a thermal conductor film. Accordingly, the use of such superconducting wires makes it possible to produce highly reliable superconducting appliances adapted for a high current density. Thus, the present invention can advantageously contribute to the promotion of utilization of superconductivity in the fields of various power-related appliances, nuclear fusion, magnets for researches related to high-energy physics, etc.

A superconducting wire wherein the surface of a wire element with a number of filaments is covered with a multi-layer film having insulator films and thermal conductor films laminated alternately with each other can further improve the stabilities of superconducting appliances.

The invention has been described in detail with respect to preferred embodiments, and it will now be apparent from the foregoing to those skilled in the art that changes and modifications may be made without departing from the invention in is broader aspects, and it is the invention, therefore, in the appended claims to cover all such changes and modifications as fall within the true spirit of the invention.

What is claimed is:

1. A superconducting wire comprising:
   a wire element including a metallic matrix and a plurality of superconducting filaments arranged in said metallic matrix; and
   a covering layer on the surface of said metallic matrix having a laminated structure with at least one thermal insulator film as a lower layer and at least one thermal conductor film as an upper layer.

2. A superconducting wire as claimed in claim 1, wherein said laminated structure is composed of a plurality of insulator films and a plurality of thermal conductor films laminated alternately with each other.

3. A superconducting wire as claimed in claim 1, wherein said at least one thermal conductor film is made of copper or copper alloy.

4. A superconducting wire as claimed in claim 1, wherein said at least one thermal conductor film is made of silver.

5. A superconducting wire as claimed in claim 1, wherein said at least one thermal conductor film is made of diamond.

6. A superconducting wire as claimed in claim 1, wherein the thickness of said at least one thermal conductor film is in the range of 0.1 μm to 50 μm.

7. A superconducting wire as claimed in claim 1, wherein said at least one insulator film is made of a polyimide resin.

8. A superconducting wire as claimed in claim 1, wherein said at least one thermal conductor film is made of a polyvinylformal resin.

9. A superconducting wire as claimed in claim 1, wherein said at least one thermal conductor film is made of a polyamide resin.

10. A superconducting wire as claimed in claim 1, wherein the thickness of said at least one insulator film is in the range of 1 μm to 100 μm.

11. A superconducting cable comprising:
a plurality of superconducting wires which are assembled to form said cable; each of said superconducting wires includes a wire element, which is composed of a metallic matrix and a plurality of superconducting filaments arranged in said metallic matrix, and a covering layer formed on a surface of said wire element and having a laminated structure of at least one insulator film as a lower layer and at least one thermal conductor film as an upper layer.

12. A superconducting cable as claimed in claim 11, wherein said cable is a flat cable.

* * * * *